United States Patent
Lien et al.

(10) Patent No.: US 7,619,317 B2
(45) Date of Patent: Nov. 17, 2009

(54) CARRIER STRUCTURE FOR SEMICONDUCTOR CHIP AND METHOD FOR MANUFACTURING THE SAME

(75) Inventors: Chung-Cheng Lien, Hsinchu (TW); Chia-Wei Chang, Hsinchu (TW)

(73) Assignee: Phoenix Precision Technology Corporation, Hsinchu (TW)

(*) Notice: Subject to any disclaimer, the term of this patent is extended or adjusted under 35 U.S.C. 154(b) by 119 days.

(21) Appl. No.: 11/984,349

(22) Filed: Nov. 16, 2007

(65) Prior Publication Data
US 2008/0116562 A1 May 22, 2008

(30) Foreign Application Priority Data
Nov. 17, 2006 (TW) ............... 95142545 A (51) Int. Cl.
H01L 23/28 (2006.01)
H05K 1/18 (2006.01)
(52) U.S. Cl. ............ 257/787; 361/764; 257/E23.004
(58) Field of Classification Search ......... 257/700, 257/787, E23.004; 361/760–764, 767–768, 361/776, 783; 174/260–262; 425/127
See application file for complete search history.

(56) References Cited

U.S. PATENT DOCUMENTS

| | | | |
|---|---|---|---|
| 2002/0017716 A1* | 2/2002 | Ohtaka et al. | 257/712 |
| 2005/0253244 A1* | 11/2005 | Chang | 257/692 |
| 2006/0186531 A1* | 8/2006 | Hsu | 257/700 |

* cited by examiner

*Primary Examiner*—David A Zarneke
*Assistant Examiner*—Jenny L Wagner
(74) *Attorney, Agent, or Firm*—Bacon & Thomas, PLLC (57) ABSTRACT

A carrier structure for a semiconductor chip and a method for manufacturing the same are disclosed. The method includes the following steps: providing a carrier board having at least one through cavity, wherein a removable film is formed on the surface of the carrier board, and a semiconductor chip is temporarily fixed in the through cavity by the removable film; filling the gap between the through cavity of the carrier board and the semiconductor chip with an adhesive material in order to fix the semiconductor chip; and removing the removable film. The disclosed method can reduce the alignment error resulted from the tiny shift of the semiconductor chip caused by jitters before the semiconductor is fixed in the cavity, thereby to increase the accuracy of the alignment, to facilitate fine wiring, and to meet the trend toward compact size of semiconductor packages.

6 Claims, 14 Drawing Sheets

FIG. 1 (Prior arts)

CARRIER STRUCTURE FOR SEMICONDUCTOR CHIP AND METHOD FOR MANUFACTURING THE SAME

BACKGROUND OF THE INVENTION

1. Field of the Invention

The present invention relates to a carrier structure for a semiconductor chip and a method for manufacturing the same, and especially, to a method for manufacturing a carrier structure having a cavity in which a semiconductor chip is disposed.

2. Description of Related Art

Customer demands of the electronics industry continue to evolve rapidly and the main trends are high integration and miniaturization. In order to satisfy those requirements, especially in the packaging of semiconductor devices, development of packaging substrates sufficing active and passive components and conductive wires has progressed from single layer to multiple layers. This means that a greater usable area is available due to interlayer connection technology.

In the conventional semiconductor device, semiconductor chips are mounted on the front side surface of a substrate by its inactive surface, and then are processed by wire bonding, or semiconductor chips are directly conducted by its active surface with the front side surface of a substrate by flip-chip technology. After that, solder balls are implanted on the back side surface of the substrate to provide electrical connections for a printed circuit board. Although an objective of high quantity pin counts is achieved, it is limited that electric characteristics are unable to be improved in higher-frequency and higher-speed operation due to long pathways of conductive wires.

In many studies, semiconductor chips directly electrically connecting to external electronic devices are embedded into a packaging substrate to shorten conductive pathways, to decrease signal loss and distortion, and to increase abilities of high-speed operation.

Figure 1:
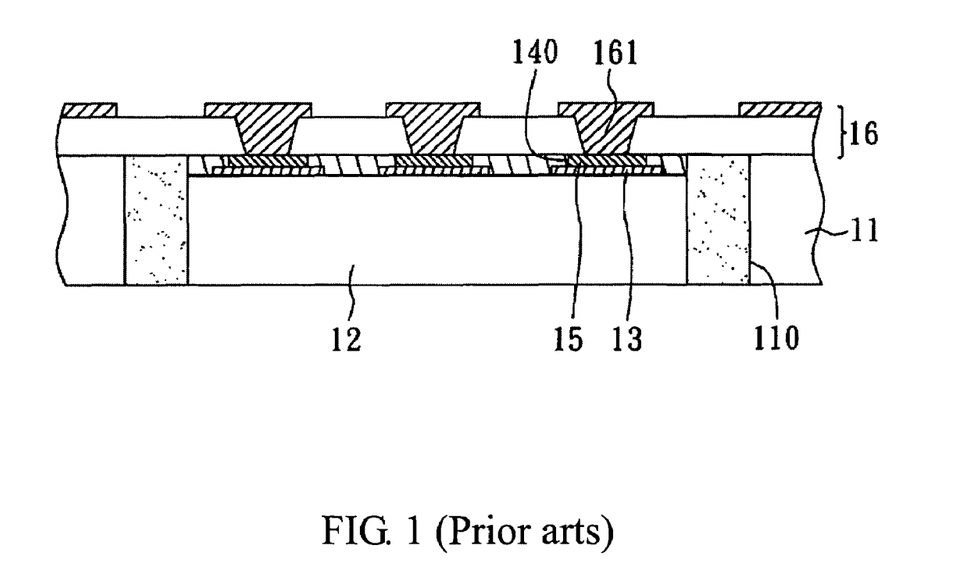
FIG. 1 is a cross-sectional view of a conventional carrier structure embedded with chips.

In a carrier structure having a chip embedded therein, as shown in FIG. 1, metal layers are added on electrode pads of an active surface of the chip for preventing destruction by laser ablation of the chip in a carrier. The carrier structure having a chip embedded therein includes: a carrier board 11 having a through cavity 110 formed therein; a chip 12 placed in the cavity 110, wherein the active surface of the chip 12 has a plurality of electrode pads 13 thereon; a protective layer 14, having a plurality of openings 140 exposing the electrode pads 13, formed on the active surface of the chip 12; a plurality of metal layers 15 formed on surfaces of the electrode pads 13; and a built-up structure 16 formed on the active surface of the chip 12 and on one surface of the carrier board 11 on the same side with the active surface of the chip 12. The built-up structure 16 has a plurality of conductive vias 161 to electrically connect the electrode pads 13 of the chip 12.

Currently, in a carrier structure embedded with chips, the cavity of the carrier board is used for disposing the chip. However, a gap exists between the chip and the carrier board. Prior to fixing the chip, tiny shifts occur inevitably. Therefore, alignment errors caused by the shifts of the chip are already greater than those resulted from formation of via holes by laser ablation. In order to benefit circuit layers to electrically connect the electrode pads, those pads of the chip have to be formed in a size about 200~250 μm. Accordingly, alignment by laser ablation will be more available during the formation of built-up structures, and failure of alignment will not occur, thus avoiding destruction of the chip. Nevertheless, the greater electrode pads of the semiconductor can not satisfy the demand of circuit miniaturization nowadays. On the other hand, due to aforementioned alignment errors, panels used during manufacturing circuit layer have to be exposed many times in part to control alignment errors being smaller, hence manufacturing processes are difficult to be simplified. Conclusively, prior arts do not satisfy the requirements of circuit miniaturization, and are not capable of following the trends of compact semiconductor packages.

Furthermore, an adhesive material is required to fill in the gap between the chip and the cavity of the carrier board so that the problem of excess adhesive material spilling out of the gap prior to solidification can occur. In order to avoid the problem illustrated above, complexity of the manufacturing processes will be unavoidably increased. Finally, problems of stress between different materials still occur in prior arts to cause warpage, delamination, or popcorn of the carrier board. Therefore, those problems have become imperative issues to be solved by the industry.

SUMMARY OF THE INVENTION

In view of the foregoing shortcomings, an object of the present invention is to provide a method for manufacturing a carrier structure for a semiconductor chip. This method can avoid alignment errors resulting from tiny shifts of the unfixed semiconductor chip located in the cavity of the carrier board. Therefore, the method benefits to advance the alignment accuracy, to simplify manufacturing processes, and to achieve the goal of fine circuits.

Another object of the present invention is to provide a method for manufacturing a carrier structure for a semiconductor chip so that the problem of excess adhesive material spilling out of a gap prior to solidification can be avoided to reduce the complexity of manufacturing processes.

Further another object of the present invention is to provide a carrier structure for a semiconductor chip. The carrier structure has a property of dispersing stress between different materials in order to reduce occurrence of delamination.

In order to achieve the above-mentioned objects, the present invention provides a method for manufacturing a carrier structure for semiconductor chips. The method comprises the steps: providing a carrier board having a first surface and an opposite second surface, wherein the carrier board has at least one through cavity in which a semiconductor chip, having an active surface with a plurality of electrode pads thereon and an opposite inactive surface, is disposed, and a first removable film is formed on the first surface of the carrier board and on one surface of the semiconductor chip on the same side with the first surface of the carrier board so as to temporarily fix the semiconductor chip; filling the gap between the through cavity of the carrier board and the semiconductor chip with an adhesive material in order to fix the semiconductor chip, wherein the first removable film is dented into the gap between the cavity of the carrier board and the semiconductor chip so that the adhesive material does not spill out of the gap; and removing the first removable film, wherein the revealed surface of the adhesive material is a concave surface resulted from the dented first removable film.

In the present invention, the carrier board comprises a first core layer, a second core layer, and an inner adhesive layer. The inner adhesive layer is located between the first and second core layers to form a sandwich structure. Then, the sandwich structure is combined by thermal pressing to obtain the carrier structure. Part of the inner adhesive layer is squeezed into the gap between the through cavity of the carrier board and the semiconductor chip so as to fix the semiconductor chip.

The method illustrated above further comprises forming a second removable film on the second surface of the carrier board and on the other surface of the semiconductor chip on the same side with the second surface of the carrier board before filling the gap so that the adhesive material does not spill out of the gap and the semiconductor chip is protected. Then, the second removable film is removed after the first removable film is removed.

In the present invention, the first and second core layers independently can be metal materials, ceramics materials, circuit boards, or other dielectric materials. Besides, the metal materials can be one selected from the group consisting of Cu, Al, Ni, Fe, Ti, and Mg, or the alloy of the group. The dielectric materials can be photosensitive or non-photosensitive organic resins such as ABF (Ajinomoto Build-up Film), PPE (poly(phenylene ether)), PTFE (poly(tetra-fluoroethylene)), FR4, FR5, BT (bismaleimide triazine), LCP (liquid crystal polymer), BCB (benzocyclo-buthene), PI (poly-imide), and aramide. Preferably, the first and second core layers independently can be circuit boards having circuit structures.

Besides, the inner adhesive layer located between the first and second core layers, and the adhesive material filling in the gap between the through cavity of the carrier board and the semiconductor chip can be made of one selected from the group consisting of organic dielectric materials, liquid organic resin materials, and pre-preg materials, but preferably are made of pre-preg.

The semiconductor chip in the present invention can be temporarily fixed in the through cavity of the carrier board by the active or inactive surface of the semiconductor chip attached on the first removable film.

In the present invention, the first removable film is used to temporarily fix the semiconductor chip. The first removable film can be made of heat-resistant and removable adhesive film materials, but preferably is a release film or an adhesive tape.

The method of the present invention further comprises forming a built-up structure on the active surface of the semiconductor chip and on one surface of the carrier board on the same side with the active surface of the semiconductor chip. The built-up structure comprises at least one dielectric layer, one circuit layer stacked on every dielectric layer, a plurality of conductive vias, and a plurality of conductive pads, and parts of the conductive vias electrically connect to the electrode pads of the semiconductor chip.

The present invention also provides a carrier structure for semiconductor chips. The carrier structure comprises a carrier board having at least one through cavity in which a semiconductor chip, having an active surface with a plurality of electrode pads thereon and an opposite inactive surface, is disposed; an adhesive material filling the gap between the through cavity of the carrier board and the semiconductor chip in order to fix the semiconductor chip, wherein the revealed surface of the adhesive material is a concave surface; and a built-up structure having at least one dielectric layer, wherein the dielectric layer is formed on the active surface of the semiconductor chip, on one surface of the carrier board on the same side with the active surface of the semiconductor chip, and on the concave surface of the adhesive material so that the combination of the dielectric layer and the concave surfaces of the adhesive material is advantageous to disperse the stress between different materials.

In the structure described above, the carrier board comprises a first core layer, a second core layer, and an inner adhesive layer. The inner adhesive layer is located between the first and second core layers to form a sandwich structure. The first and second core layers independently can be metal materials, ceramics materials, circuit boards, or other dielectric materials. The inner adhesive layer and the adhesive material can be made of one selected from the group consisting of organic dielectric materials, liquid organic resin materials, and pre-preg materials.

In the foregoing structure, the active surface of the semiconductor chip can has a height the same as, higher than, or lower than that of the surface of the carrier board on the same side with the active surface.

In the foregoing structure, the built-up structure further comprises one circuit layer stacked on every dielectric layer, a plurality of conductive vias, and a plurality of conductive pads, and parts of the conductive vias electrically connect to the conductive pads of the semiconductor chip.

Hence, in the present invention, the semiconductor chip is fixed temporarily in the through cavity of the carrier board by the first removable film. Then, the semiconductor chip is fixed thoroughly by filling by the adhesive material. Therefore, the problem of alignment errors caused by tiny shifts of the semiconductor chip prior to being fixed in the through cavity of the carrier board can be solved so that the alignment accuracy will be promoted to benefit circuit miniaturization. Moreover, in the present invention, only one exposure is needed for panels during manufacturing for one circuit layer. Hence, possible alignment errors can be controlled to a smaller range so as to simplify the manufacturing processes. Furthermore, the problem of an adhesive material spilling out of a gap prior to solidification can be solved to reduce the complexity of manufacturing processes. The carrier structure of the present invention has a property of dispersing stress between different materials in order to reduce occurrence of delamination.

Other objects, advantages, and novel features of the invention will become more apparent from the following detailed description when taken in conjunction with the accompanying drawings.

DETAILED DESCRIPTION OF THE PREFERRED EMBODIMENT

Because of the specific embodiments illustrating the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

Embodiment 1

Figure 2A:
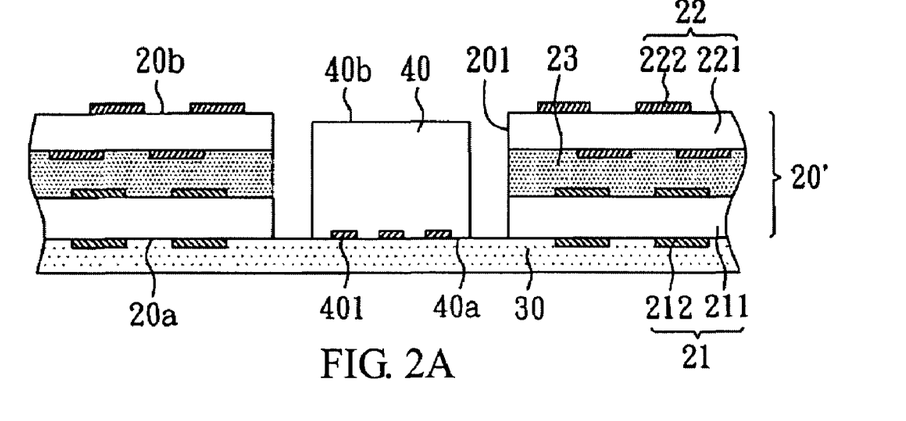
FIGS. 2A to 2D show a manufacturing flow chart in cross-sectional views in the embodiment of the present invention.

With reference to FIGS. 2A to 2D, there is shown a flow chart in cross-sectional views for manufacturing a carrier structure for a semiconductor chip in the present invention. As shown in FIG. 2A, a carrier board 20 having a first surface 20a and an opposite second surface 20b is provided. The carrier board 20 has at least one through cavity 201. A semiconductor chip 40 having an active surface 40a and an opposite inactive surface 40b is disposed in the through cavity 201. A first removable film 30 is formed on the first surface 20a of the carrier board 20 so that the semiconductor chip 40 is fixed temporarily by the active surface 40a thereof in the through cavity 201 of the carrier board 20. The carrier board 20 consists of a first core layer 21, a second core layer 22, and an inner adhesive layer 23. The inner adhesive layer 23 is located between the first core layer 21 and the second core layer 22 to form a sandwich structure 20'. The sandwich structure 20' is manufactured by stacking the inner adhesive layer 23 on the surface of the first core layer 21, and subsequently stacking the second core layer 22 on the surface of the inner adhesive layer 23. Then, at least one through cavity 201 is formed by drilling the sandwich structure 20'.

Herein, the first core layer 21 and the second core layer 22 independently can be metal materials, ceramics materials, circuit boards, or other dielectric materials. Besides, the metal materials can be one selected from the group consisting of Cu, Al, Fe, Ti, and Mg or the alloy of the group. The dielectric materials can be photosensitive or non-photosensitive organic resins such as ABF (Ajinomoto Build-up Film), PPE (poly(phenylene ether)), PTFE (poly(tetra-fluoroethylene)), FR4, FR5, BT (bismaleimide triazine), LCP (liquid crystal polymer), BCB (benzocyclo-buthene), PI (poly-imide), and aramide. In the present embodiment, the first core layer 21 is a circuit board 211 having circuit 212, and the second core layer 22 is a circuit board 221 having circuit 222. The inner adhesive layer 23 can be made of one selected from the group consisting of organic dielectric materials, liquid organic resin materials, and pre-preg materials. In the present embodiment, the inner adhesive layer 23 is pre-preg.

The semiconductor chip 40 illustrated above can be an active component or a passive component.

Moreover, the first removable film 30 in the present embodiment is used to temporarily fix the semiconductor chip 40. The first removable film 30 can be made of heat-resistant and removable adhesive film materials. In the present embodiment, a release film is used.

Figure 2B:
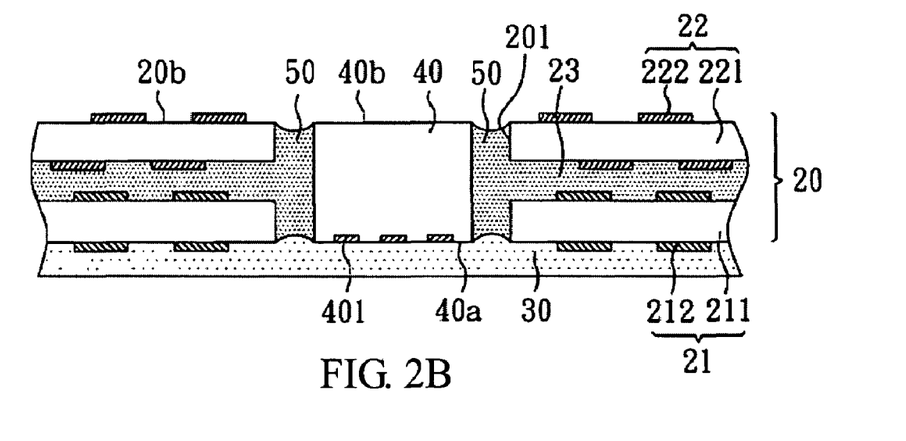

In FIG. 2B, the gap between the through cavity 201 of the carrier board 20 and the semiconductor chip 40 is filled with an adhesive material 50 in order to fix the semiconductor chip 40. The first removable film 30 is dented into the gap between the cavity 201 so that the adhesive material 50 does not spill from the gap. The adhesive material 50 can be made of the same material as the inner adhesive layer 23. When the carrier board 20 is formed by thermal pressing the sandwich structure 20' consisting of the first core layer 21, the second core layer 22, and the inner adhesive layer 23 disposed therebetween, part of the inner adhesive layer 23 is squeezed into the gap between the through cavity 201 of the carrier board 20 and the semiconductor chip 40, and serves as the adhesive material 50 to fix the semiconductor chip 40.

Figure 2B:
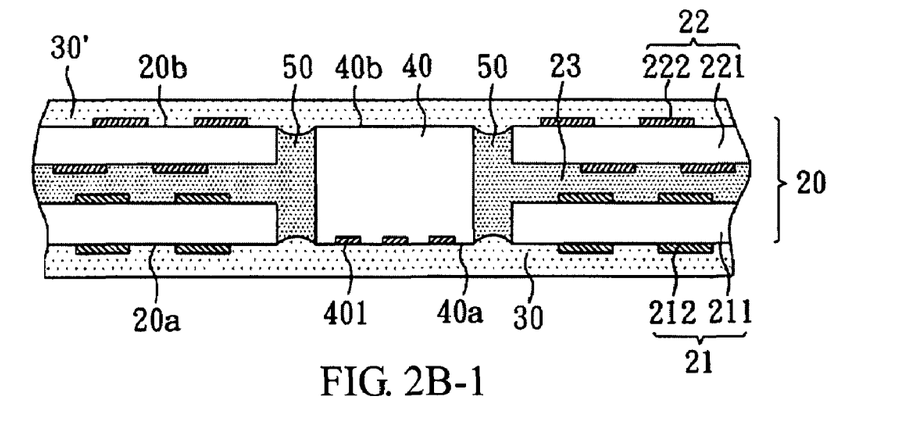
Figure 2C:
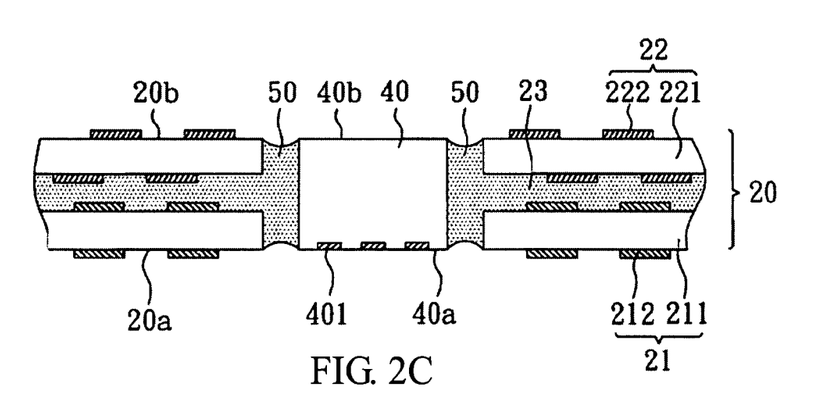

Then, the first removable film 30 in the structure described above is removed. The structure as shown in FIG. 2C is obtained. Otherwise, as shown in FIG. 2B-1, before the gap is filled by the adhesive material 50, a second removable film 30' can be formed on the second surface 20b of the carrier board 20 and on the inactive surface 40b of the semiconductor chip 40 so that the adhesive material 50 does not spill from the gap and the semiconductor chip 40 can be protected. After the first adhesive film 30 is removed, the second adhesive film 30' is also removed to obtain the structure as shown in FIG. 2C.

Figure 2D:
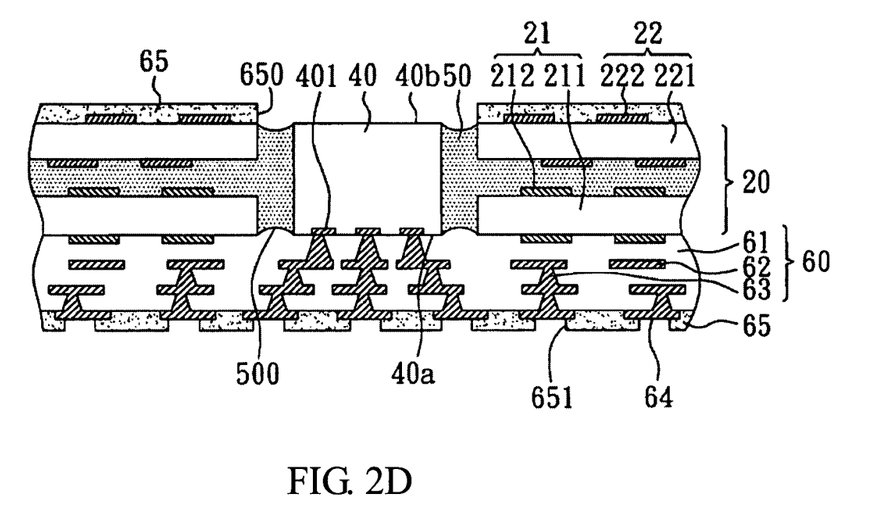

With reference to FIG. 2D, a built-up structure 60 is formed by the build-up technology on the first surface 20a of the carrier board 20 and on the active surface 40a of the semiconductor chip 40. Besides, the built-up structure 60 can be disposed on one side or on both sides (not shown in the figures) of the carrier board 20. The built-up structure 60 comprises at least one dielectric layer 61, one circuit layer 62 stacked on every dielectric layer 61, and a plurality of conductive vias 63. Parts of the conductive vias 63 electrically connect to electrode pads 401 of the semiconductor chip 40. Furthermore, a plurality of conductive pads 64 are formed on the surface of the built-up structure 60. A solder mask 65, which has a plurality of openings 651 exposing the conductive pads 64 of the built-up structure 60, is formed on the surface of the built-up structure 60. Likewise, the solder mask 65 can be formed on the second surface 20b of the carrier board 20 to protect the circuit 222 of the second core layer 22. Moreover, the solder mask 65 has a cavity 650 to expose the inactive surface 40b of the semiconductor chip 40 for heat dissipation.

Embodiment 2

Figure 3A:
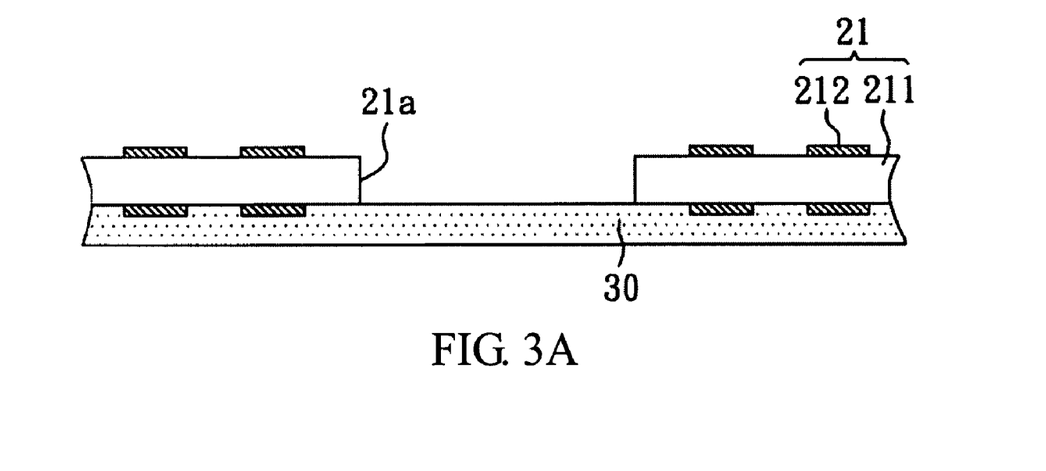
FIGS. 3A and 3B show part of a flow chart in cross-sectional views for manufacturing a carrier structure for a semiconductor chip in the embodiment of the present invention.
Figure 3B:
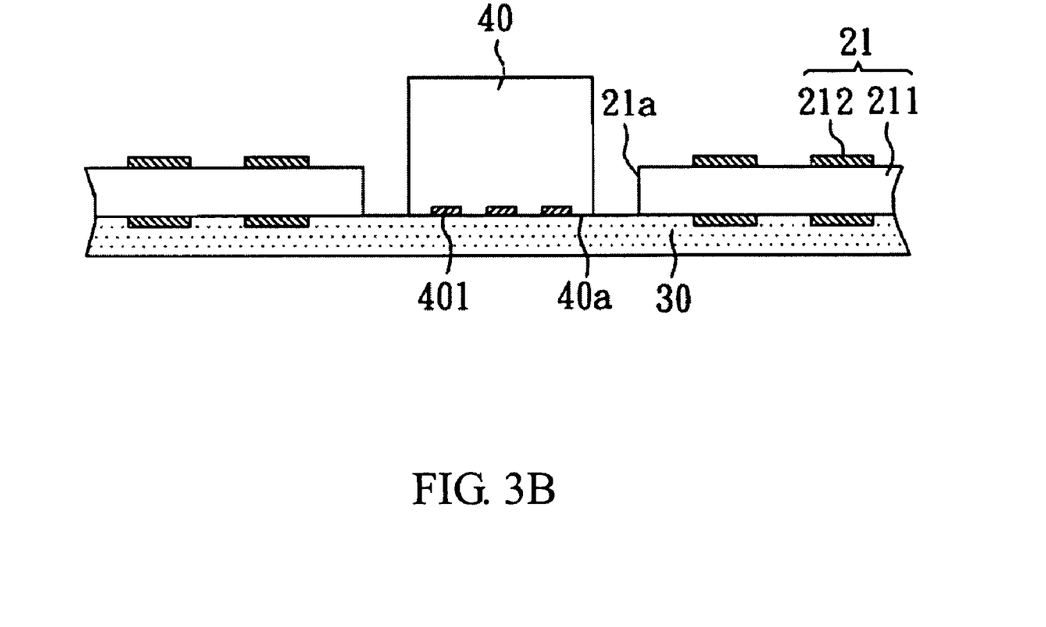

The present embodiment is approximately similar to Embodiment 1 except for the manufacturing processes of the carrier board 20. With reference to FIGS. 3A and 3B, there is a flow chart in a cross-sectional view. As shown in FIG. 3A, a core layer 21 adhered with a first removable film 30 is provided first. The core layer 21 has a cavity 21a.

Subsequently, as shown in FIG. 3B, the semiconductor chip 40 is temporarily fixed by the active surface 40a thereof adhered on the first removable film 30 in the cavity 21a of the first core layer 21. Finally, the inner adhesive layer 23 and the second core layer 22 are stacked in sequence on the other surface of the first core layer 21 so as to obtain the structure shown in FIG. 2A. Other steps followed are the same as those of Embodiment 1 hence not to be illustrated again.

Embodiment 3

Figure 4A:
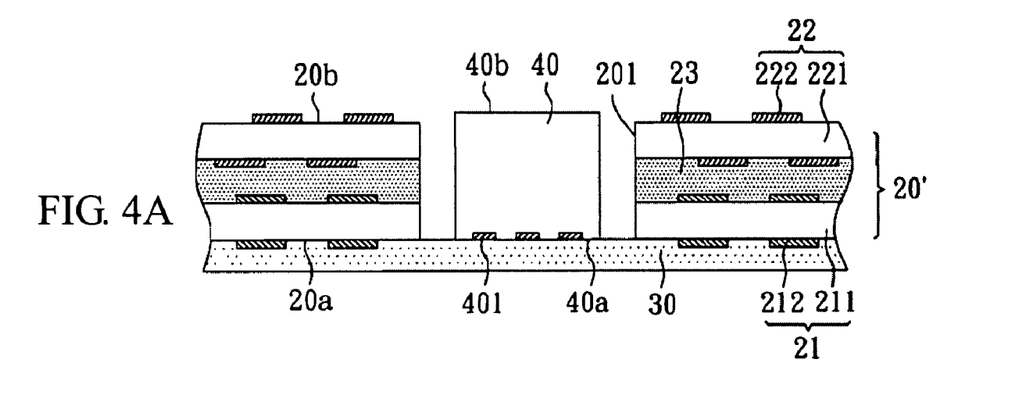
FIGS. 4A-D to 8A-D show manufacturing flow charts in cross-sectional views in other embodiments of the present invention.
Figure 4B:
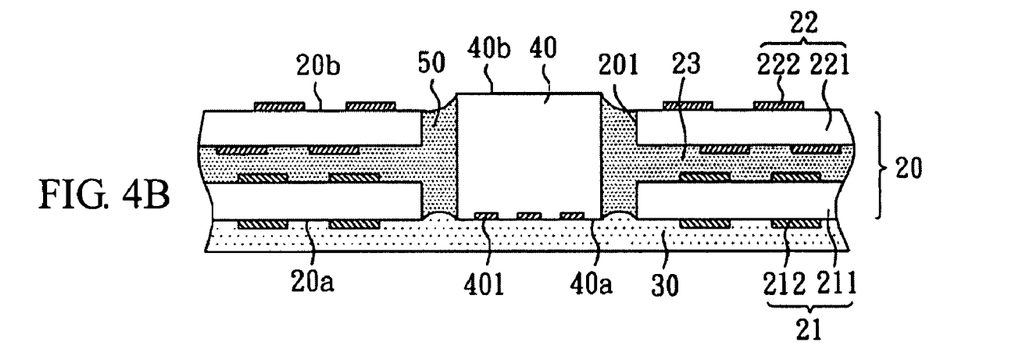
Figure 4B:
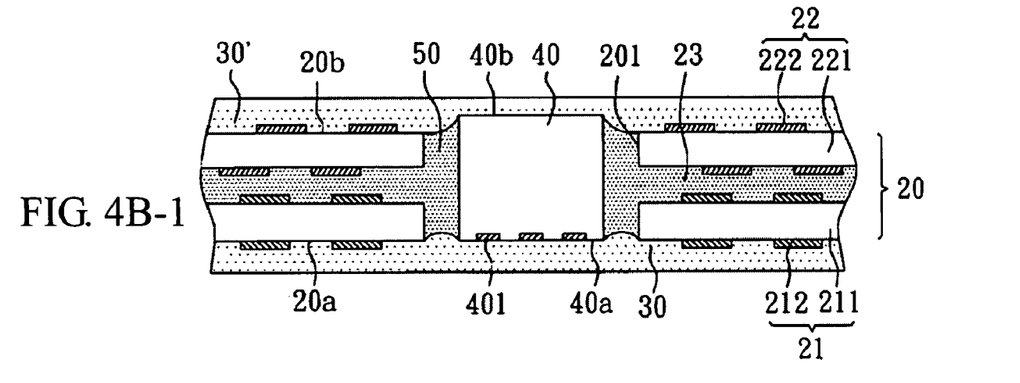
Figure 4C:
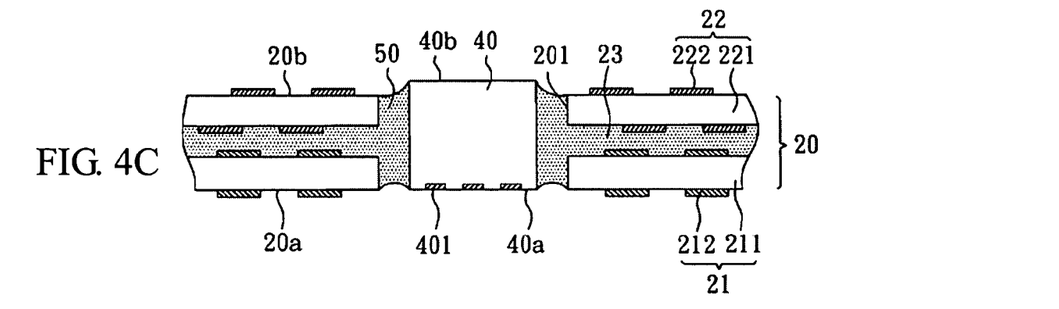
Figure 4D:
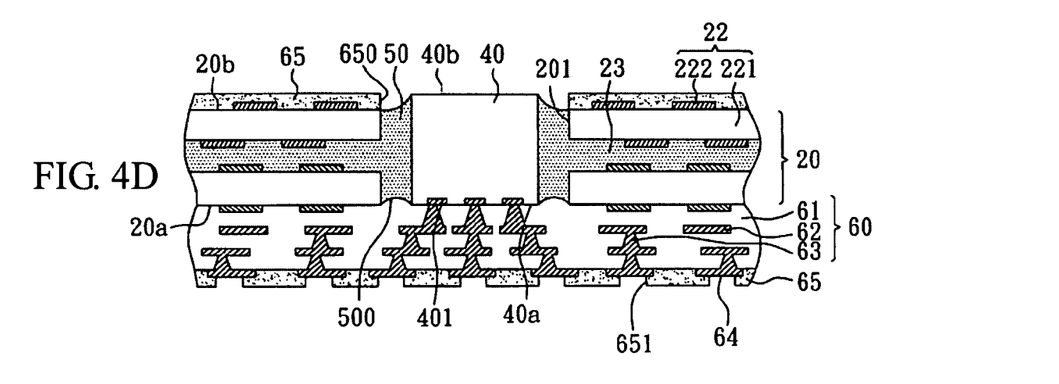
Figure 5A:
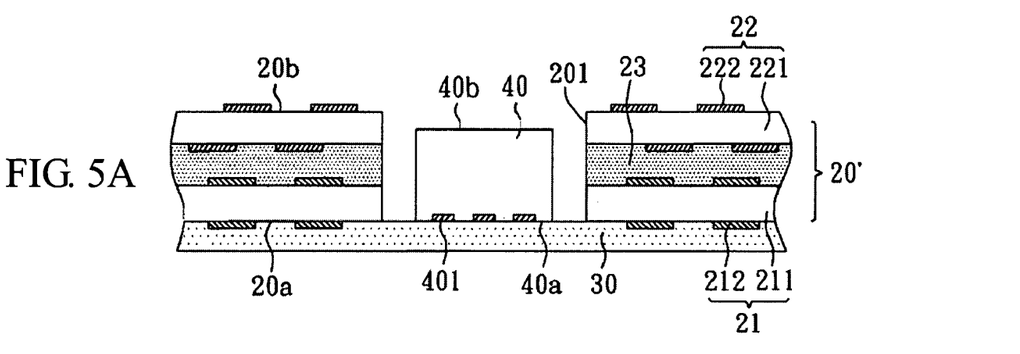
Figure 5B:
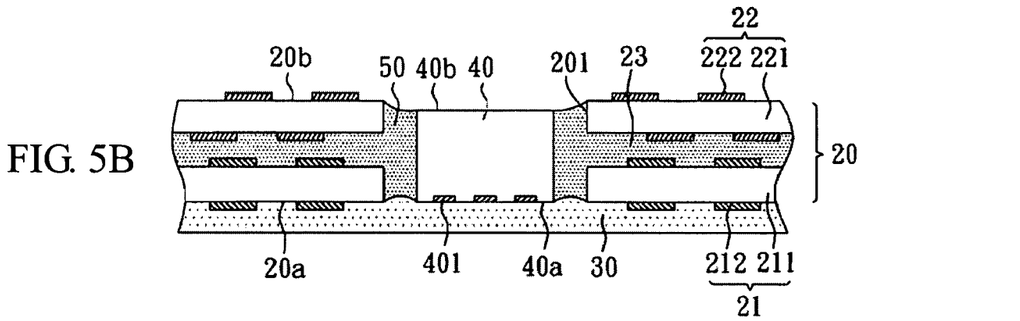
Figure 5B:
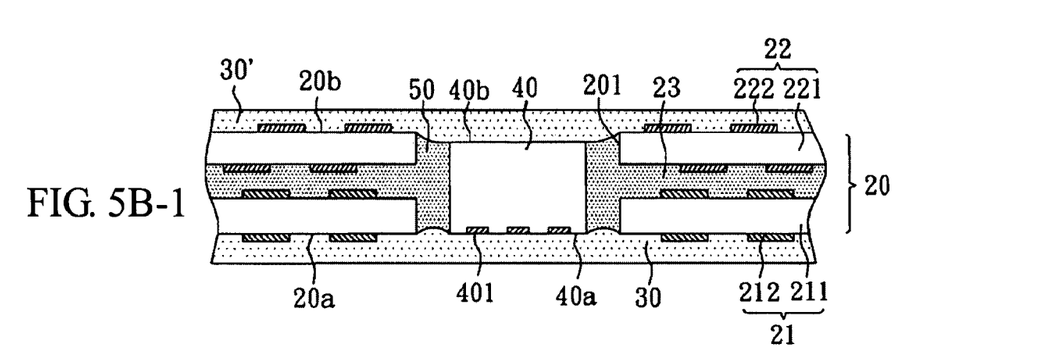
Figure 5C:
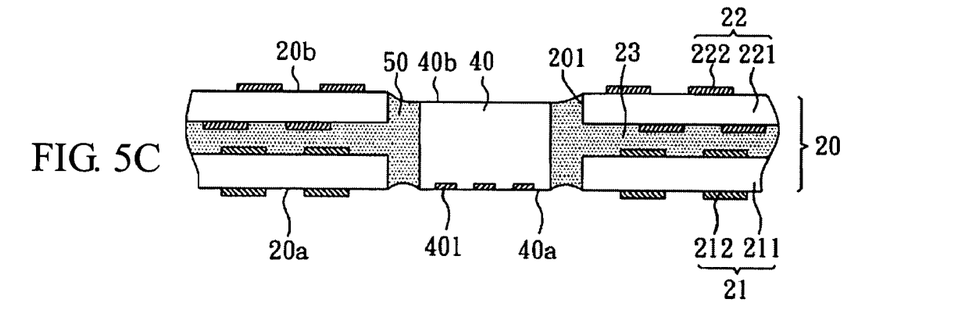
Figure 5D:
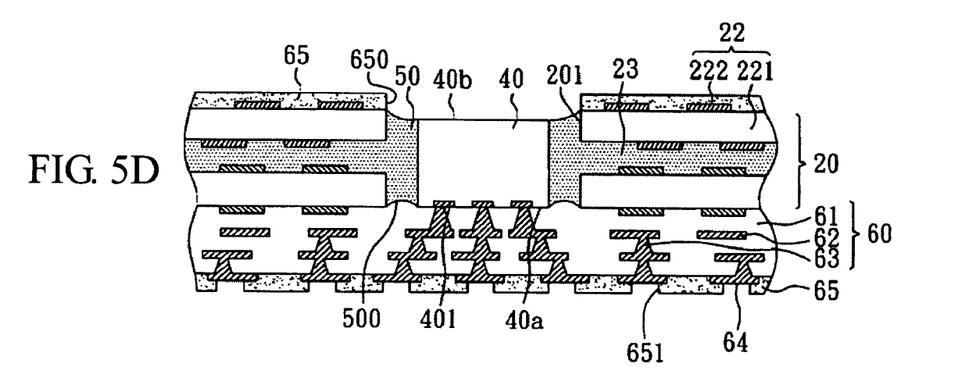
Figure 6A:
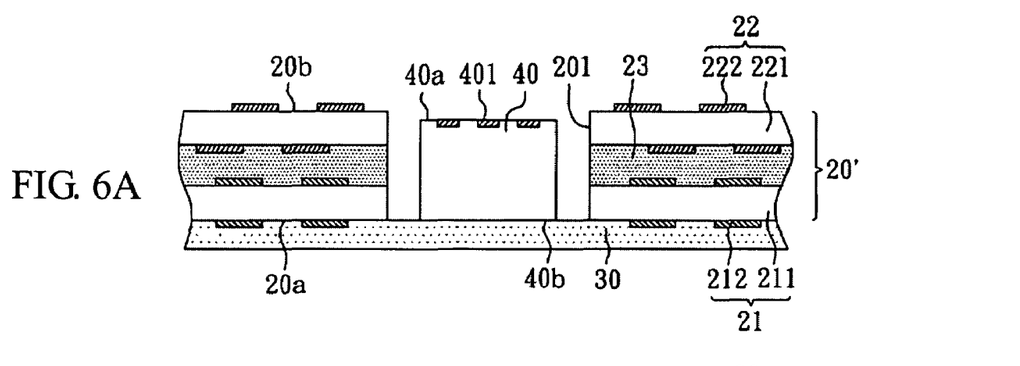
Figure 6B:
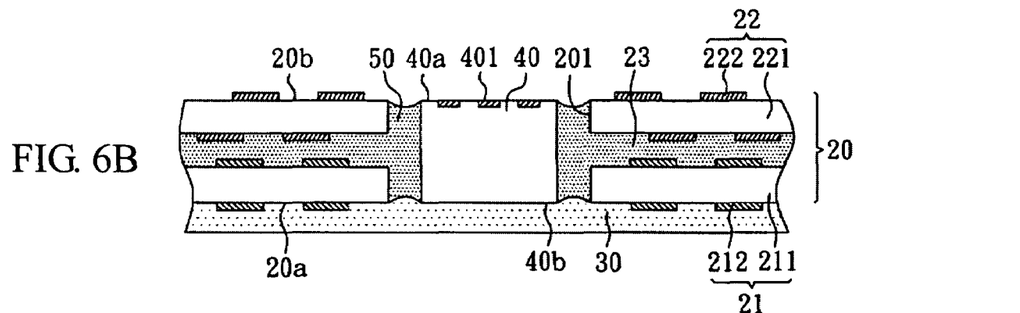
Figure 6B:
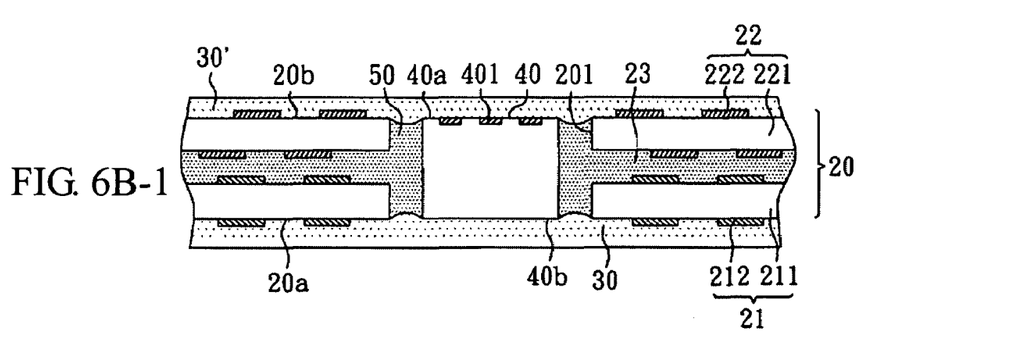
Figure 6C:
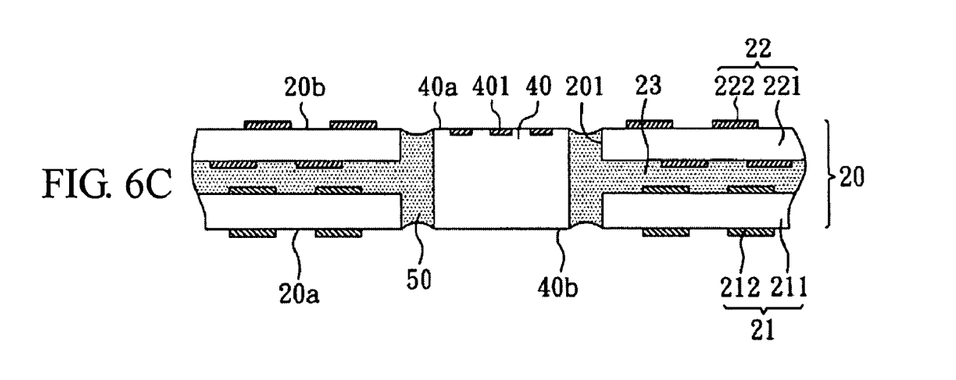
Figure 6D:
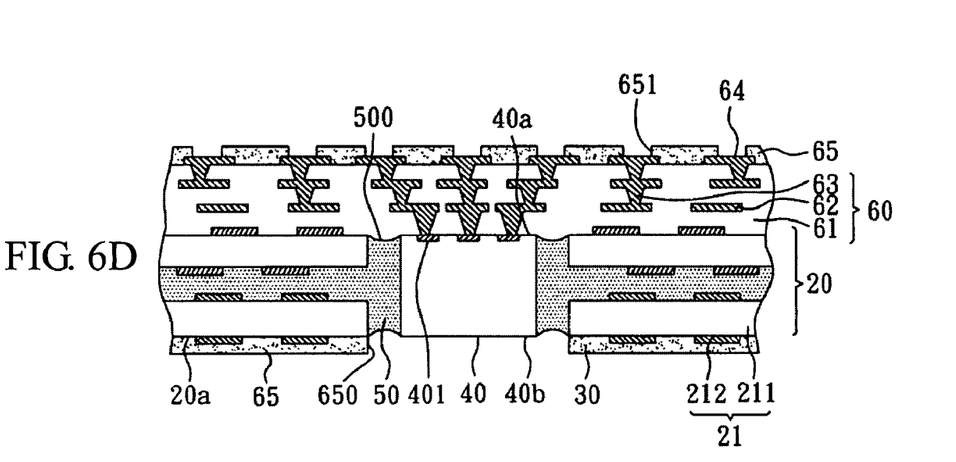

With reference to FIGS. 4A to 4D, the present embodiment is approximately similar to Embodiment 1 except the inactive surface 40b of the semiconductor chip 40 is higher than the second surface 20b of the carrier board 20 (FIG. 4C). However, in FIG. 2C of Embodiment 1, the inactive surface 40b of the semiconductor chip 40 is flush with the second surface 20b of the carrier board 20. Subsequently, other steps are the same as those of Embodiment 1 hence not to be illustrated again. Likewise, the structure of the present embodiment can be manufactured by the processes disclosed in Embodiment 2.

Embodiment 4

With reference to FIGS. 5A to 5D, the present embodiment is approximately similar to Embodiment 1 except the inactive surface 40b of the semiconductor chip 40 is lower than the second surface 20b of the carrier board 20 (FIG. 5). Subsequently, other steps are the same as those of Embodiment 1 hence not to be illustrated again. Likewise, the structure of the present embodiment can be manufactured by the processes disclosed in Embodiment 2.

Embodiment 5

With reference to FIGS. 6A to 6D, the present embodiment is approximately similar to Embodiment 1 except the semiconductor chip 40 is temporarily fixed by the inactive surface 40b thereof adhered on the first removable film 30 in the through cavity 201 of the carrier board 20 (FIG. 6C), and the active surface 40a of the semiconductor chip 40 is flush with the second surface 20b of the carrier board 20. Subsequently, other steps are the same as those of Embodiment 1 hence not to be illustrated again. Likewise, the structure of the present embodiment can be manufactured by the processes disclosed in Embodiment 2.

Embodiment 6

Figure 7A:
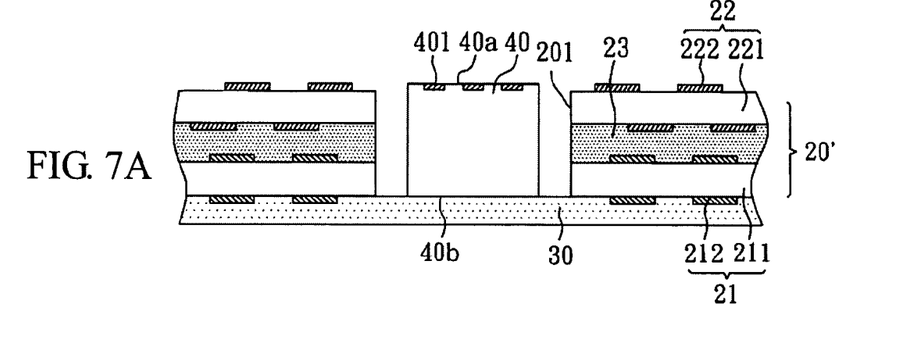
Figure 7B:
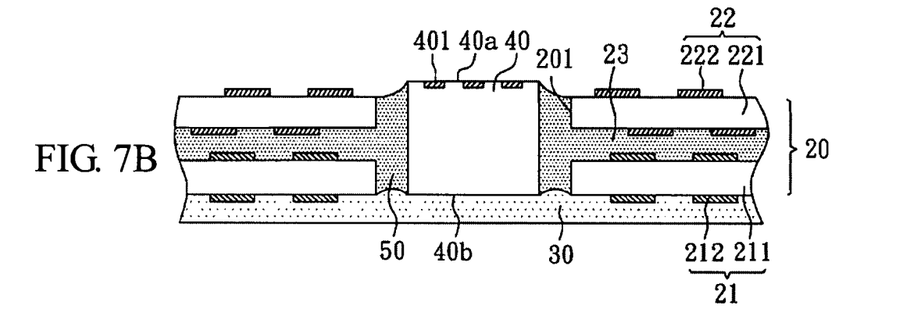
Figure 7B:
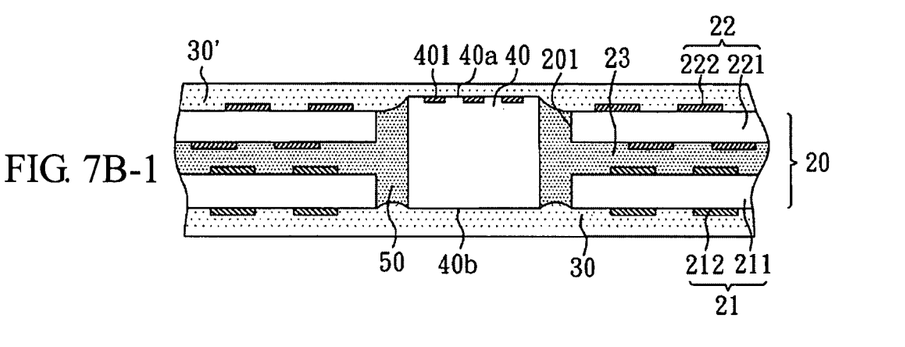
Figure 7C:
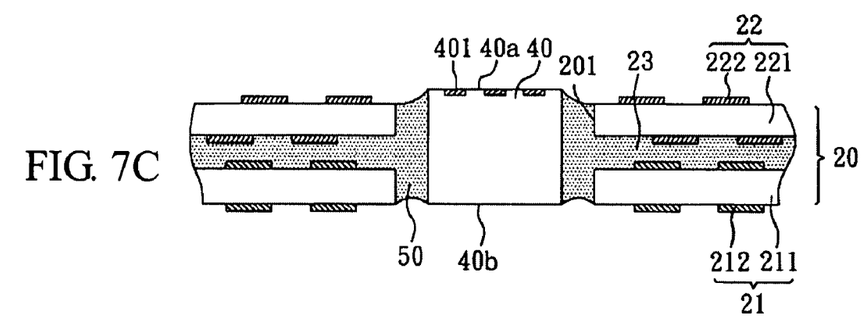
Figure 7D:
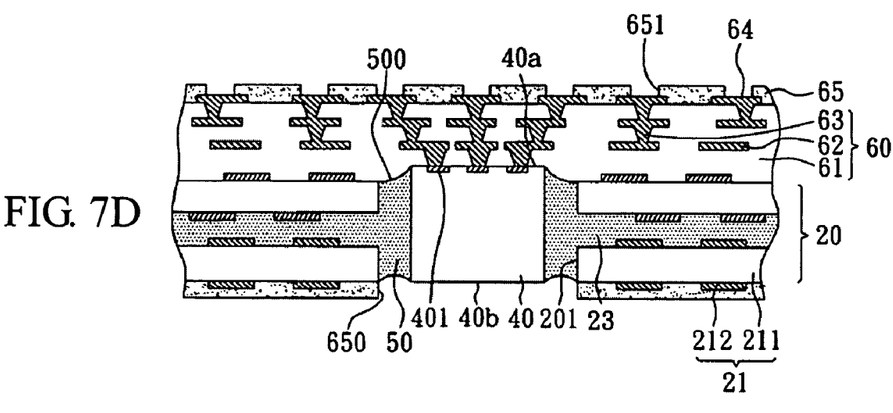

With reference to FIGS. 7A to 7D, the present embodiment is approximately similar to Embodiment 5 except the active surface 40a of the semiconductor chip 40 is higher than the second surface 20b of the carrier board 20 (FIG. 7C). Subsequently, other steps are the same as those of Embodiment 1 hence not to be illustrated again. Likewise, the structure of the present embodiment can be manufactured by the processes disclosed in Embodiment 2.

Embodiment 7

Figure 8A:
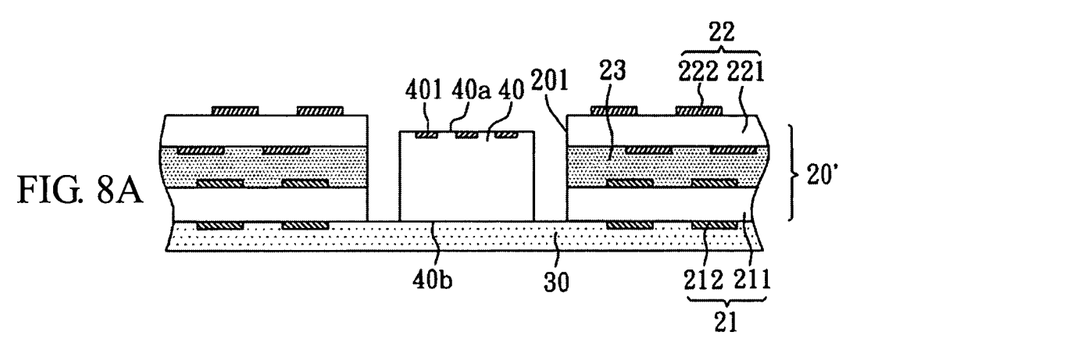
Figure 8B:
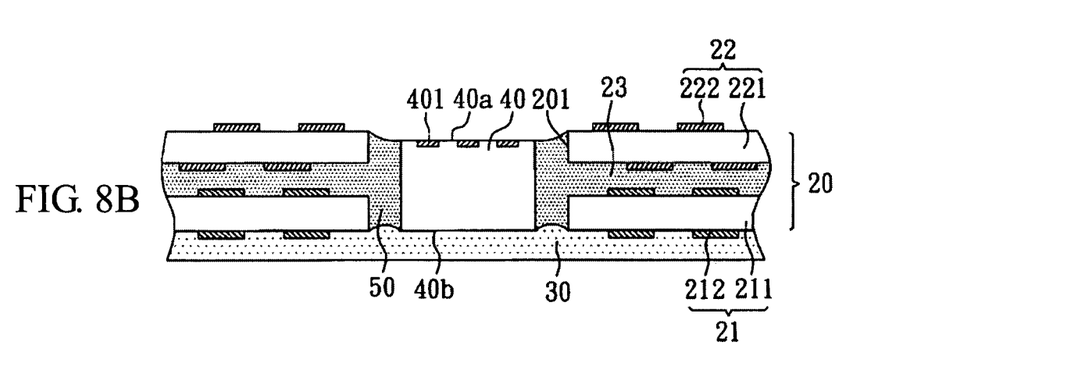
Figure 8B:
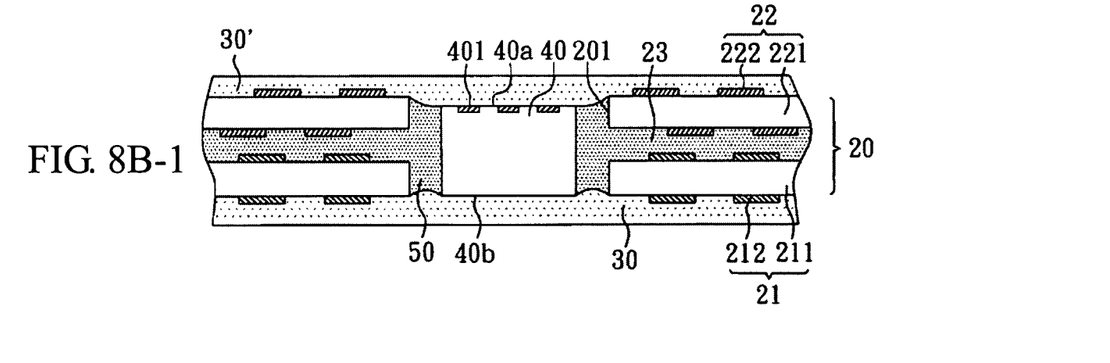
Figure 8C:
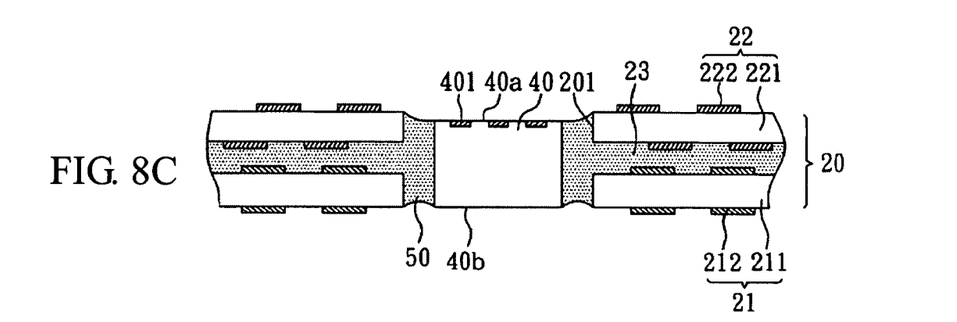
Figure 8D:
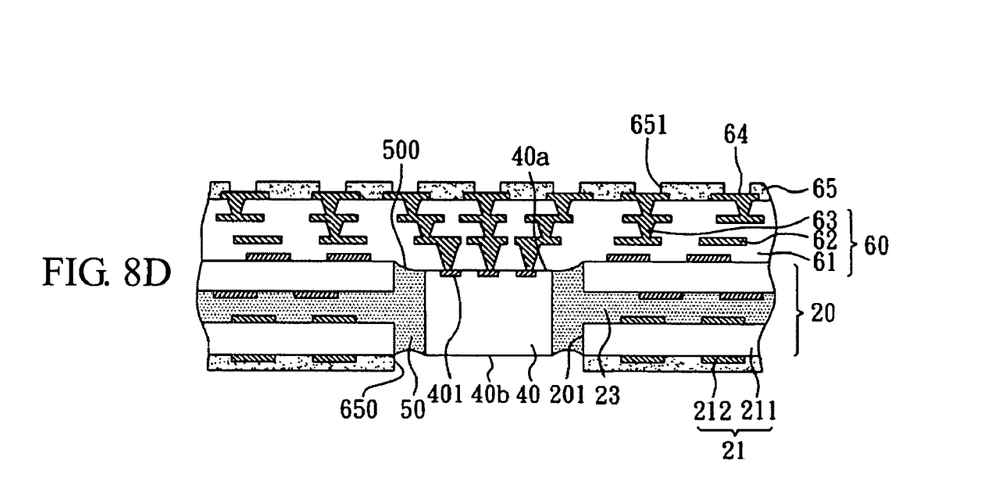

With reference to FIGS. 8A to 8D, the present embodiment is approximately similar to Embodiment 5 except the active surface 40a of the semiconductor chip 40 is lower than the second surface 20b of the carrier board 20 (FIG. 8C). Subsequently, other steps are the same as those of Embodiment 1 hence not to be illustrated again. Likewise, the structure of the present embodiment can be manufactured by the processes disclosed in Embodiment 2.

Conclusively, besides the methods disclosed in Embodiments 1 and 2, another method for disposing the semiconductor chip in the carrier board is mentioned as follows. A first core layer of which an inner adhesive layer is laminated on one surface is provided first. A cavity is formed in a structure of the first core layer laminated with the inner adhesive layer. Then, a first removable film is formed on the other surface of the first core layer. A semiconductor chip is temporarily fixed by the first removable film in the cavity. Finally, a second core layer with a cavity is laminated on the surface of the inner adhesive layer. Therefore, the structure as shown in FIG. 2A can be obtained by various methods.

The present invention also provides a carrier structure for semiconductor chips as shown in FIGS. 2D, 4D, 5D, 6D, 7D, and 8D. The carrier structure comprises a carrier board 20 having at least one through cavity 201 in which a semiconductor chip 40, having an active surface 40a with a plurality of electrode pads 401 thereon and an opposite inactive surface 40b, is disposed; an adhesive material 50 filling the gap between the through cavity 201 of the carrier board 20 and the semiconductor chip 40 in order to fix the semiconductor chip 40, wherein the revealed surface of the adhesive material 50 is a concave surface 500; and a built-up structure 60 having at least one dielectric layer 61, wherein the dielectric layer 61 is formed on the active surface 40a of the semiconductor chip 40, on one surface of the carrier board 20 on the same side with the active surface 40a of the semiconductor chip 40, and on the concave surface 500 of the adhesive material 50 so that the combination of the dielectric layer 61 and the concave surfaces 500 of the adhesive material 50 is advantageous to disperse the stress between different materials.

In the structure described above, the carrier board 20 comprises a first core layer 21, a second core layer 22, and an inner adhesive layer 23. The inner adhesive layer 23 is located between the first core layer 21 and the second core layer 22. The first core layer 21 and the second core layer 22 independently can be metal materials, ceramics materials, circuit boards, or other dielectric materials. Besides, the inner adhesive layer 23 and the adhesive material 50 can be made of one selected from the group consisting of organic dielectric materials, liquid organic resin materials, and pre-preg materials.

In the foregoing structure, the active surface 40a of the semiconductor chip 50 can be higher (FIG. 7D) than, lower (FIG. 8D) than, or flush (FIGS. 2D and 6D) with the surface of the carrier board 20 on the same side.

In the foregoing structure, the built-up structure 60 further comprises one circuit layer 62 stacked on every dielectric layer 61, a plurality of conductive vias 63, and a plurality of conductive pads 64, and parts of the conductive vias 63 electrically connect to the conductive pads 401 of the semiconductor chip 40.

Moreover, a solder mask 65 can be formed on the surface of the built-up structure. The solder mask 65 has a plurality of openings 651 so as to expose the conductive pads 64 of the built-up structure 60. Likewise, the solder mask layer 65 can be made on the other surface of the carrier board 20.

Although the present invention has been explained in relation to its preferred embodiment, it is to be understood that many other possible modifications and variations can be made without departing from the scope of the invention as hereinafter claimed.

What is claimed is:

1. A carrier structure for a semiconductor chip comprising:
   a carrier board having at least one through cavity in which a semiconductor chip, having an active surface with a plurality of electrode pads thereon and an opposite inactive surface, is disposed;
   an adhesive material filling the gap between the through cavity of the carrier board and the semiconductor chip in order to fix the semiconductor chip, wherein a revealed surface of the adhesive material is a concave surface; and
   a built-up structure having at least one dielectric layer, wherein the dielectric layer is formed on the active surface of the semiconductor chip, on one surface of the carrier board on the same side with the active surface of the semiconductor chip, and on the concave surface of the adhesive material so that the combination of the dielectric layer and the concave surfaces of the adhesive material is advantageous to disperse the stress between different materials.

2. The carrier structure as claimed in claim 1, wherein the carrier board comprises a first core layer, a second core layer, and an inner adhesive layer, therewith the inner adhesive layer disposed between the first and second core layers, the first and second core layers made of metals, ceramics, circuit boards, or other dielectric materials, and the inner adhesive layer made of organic dielectric materials, liquid organic resin materials, or pre-preg materials.

3. The carrier structure as claimed in claim 1, wherein the adhesive material is made of organic dielectric materials, liquid organic resin materials, or pre-preg materials.

4. The carrier structure as claimed in claim 1, wherein the active surface of the semiconductor chip has a height the same as, lower than, or higher than that of the surface of the carrier board.

5. The carrier structure as claimed in claim 1, wherein the built-up structure further comprises one circuit layer stacked on every dielectric layer, a plurality of conductive vias, and a plurality of conductive pads, and parts of the conductive vias electrically connect to the conductive pads of the semiconductor chip.

6. A carrier structure for a semiconductor chip comprising:
a carrier board having at least one through cavity in which a semiconductor chip, having an active surface with a plurality of electrode pads thereon and an opposite inactive surface, is disposed;
an adhesive material filling the gap between the through cavity of the carrier board and the semiconductor chip in order to fix the semiconductor chip, the adhesive material having a concave surface where exposed; and
a built-up structure having at least one dielectric layer, wherein the dielectric layer is formed on the active surface of the semiconductor chip, on one surface of the carrier board on the same side with the active surface of the semiconductor chip, and on the concave surface of the adhesive material so that the combination of the dielectric layer and the concave surfaces of the adhesive material is advantageous to disperse the stress between different materials.

* * * * *